US010834840B2

(12) United States Patent
Otsu et al.

(10) Patent No.: US 10,834,840 B2
(45) Date of Patent: Nov. 10, 2020

(54) INDUSTRIAL ELECTRONIC APPARATUS

(71) Applicant: OMRON Corporation, Kyoto (JP)

(72) Inventors: Sadahito Otsu, Kyoto (JP); Heita Nada, Kyoto (JP); Yoshimi Azuma, Kyoto (JP)

(73) Assignee: OMRON Corporation, Kyoto (JP)

(*) Notice: Subject to any disclaimer, the term of this patent is extended or adjusted under 35 U.S.C. 154(b) by 26 days.

(21) Appl. No.: 16/326,582

(22) PCT Filed: Aug. 16, 2017

(86) PCT No.: PCT/JP2017/029430
§ 371 (c)(1),
(2) Date: Feb. 19, 2019

(87) PCT Pub. No.: WO2018/061505
PCT Pub. Date: Apr. 5, 2018

(65) Prior Publication Data
US 2020/0187377 A1 Jun. 11, 2020

(30) Foreign Application Priority Data
Sep. 30, 2016 (JP) ................. 2016-194532

(51) Int. Cl.
*H05K 7/14* (2006.01)
*F21V 8/00* (2006.01)
*H05K 5/02* (2006.01)

(52) U.S. Cl.
CPC ......... *H05K 7/1481* (2013.01); *G02B 6/0051* (2013.01); *G02B 6/0088* (2013.01); *H05K 5/0247* (2013.01)

(58) Field of Classification Search
CPC .. H05K 7/1481; H05K 5/0247; G02B 6/0051; G02B 6/008
See application file for complete search history.

(56) References Cited

U.S. PATENT DOCUMENTS

| 5,369,740 A | 11/1994 | Naylor |
| 2012/0033408 A1 | 2/2012 | Nakajima et al. |
| 2016/0293070 A1 | 10/2016 | Yoneda et al. |

FOREIGN PATENT DOCUMENTS

| DE | 112013007654 T5 | 8/2016 |
| JP | H09-22262 A | 1/1997 |
| JP | 2006-309727 A | 11/2006 |

OTHER PUBLICATIONS

An English translation of the International Search Report of PCT/JP2017/029430 dated Oct. 31, 2017.
The Written Opinion of PCT/JP2017/029430 dated Oct. 31, 2017.
The extended European search report dated Dec. 16, 2019 in a related European patent application.

*Primary Examiner* — Joseph L Williams
(74) *Attorney, Agent, or Firm* — Metrolex IP Law Group, PLLC

(57) ABSTRACT

An industrial electronic apparatus includes a display panel that includes a design portion including a character or a graphic, and a light source provided behind the display panel. The display panel includes: a transparent plate having a back face located on the light source side and a front face located on a side opposite to the light source side; a light shielding portion that is located on the back face side of the transparent plate, covers a portion, of the back face, that does not correspond to the design portion, and includes a window that is formed at a portion, of the back face, that corresponds to the design portion, and a light diffusing portion that is located on the back face side of the transparent plate, and covers a portion, of the back face of the transparent plate, that corresponds to the design portion.

15 Claims, 5 Drawing Sheets

INDUSTRIAL ELECTRONIC APPARATUS

TECHNICAL FIELD

The present invention relates to industrial electronic apparatuses that include a display portion that performs state display of some kind by turning on and off a light source, and in particular, relates to an industrial electronic apparatus represented by a programmable logic controller (hereinafter, also referred to as "PLC").

RELATED ART

In many cases, industrial electronic apparatuses used for various industrial applications are provided with a display portion that performs state display indicating whether power is on or off, an operating mode, an alert, and the like. For example, PLCs are normally provided with a display portion that shows the connection state of external wiring, in addition to performing state display indicating whether power is on or off, an operating mode, an alert, and the like.

Configurations of display portions of conventional industrial electronic apparatuses are generally divided into two types. One of them is a configuration in which, when viewing the display portion from a front side, a light emitting portion formed by a display window of a light source that is turned on or off is provided at any of an upper, lower, left, and right area adjacent to an area at which a design symbol that is formed by silk printing or the like and displays a state is provided, and the other is a configuration in which, when the display portion is viewed from a front side, a design symbol that displays a state is directly provided by silk printing or the like on a light emitting portion formed by a display window of a light source that is turned on and off.

JP 2006-309727 (Patent Document 1) is a document that specifically discloses an industrial electronic apparatus including a display portion configured like this, for example. The industrial electronic apparatus disclosed in Patent Document 1 is a PLC as mentioned above, and a display portion that performs state display indicating whether power is on or off, an operating mode, an alert, and the like (corresponding to an operation display portion 14 in FIG. 1 in Patent Document 1) adopts the former configuration described above, when a display portion that indicates the connection state of external wiring (corresponding to an input-side wiring table 4 and an output-side wiring table 5 in FIG. 1 in Patent Document 1) adopts the latter configuration described above.

RELATED ART DOCUMENT

Patent Document

Patent Document 1: JP 2006-309727A

SUMMARY OF THE INVENTION

Problem to be Solved by the Invention

However, the size of the display portion cannot be reduced while increasing visibility of a display portion by adopting any of the above-described configurations.

Specifically, if the former configuration is adopted, the visibility of a design symbol can be secured in either of the cases where a light source is turned on and off, because the area at which the design symbol is provided itself does not emit light even when the light source is turned on, but it is unavoidable that the size of the display portion as a whole increases.

On the other hand, if the latter configuration is adopted, although the size of a display portion can be reduced, because the area at which the design symbol is provided itself emits light when the light source is turned on, and although the visibility of the design symbol can be secured when the light source is turned off, it is unavoidable that the visibility of the design symbol decreases when the light source is turned on.

Also, normally, the aforementioned design symbol is provided by silk printing on a front face of a display panel in many cases, and therefore, in an industrial electronic apparatus that is installed under severe environmental conditions, in particular, there are cases where a design symbol is stained or peeled off over a long time use, and also in this regard, there is a problem in that visibility decreases.

Accordingly, this invention was made in order to solve the abovementioned problems, and an object thereof is to provide an industrial electronic apparatus in which the size of a display portion can be reduced while improving the visibility of the display portion.

Means for Solving the Problems

An industrial electronic apparatus according to one aspect of the present invention includes a housing, a display panel, and a light source. The display panel is attached to the housing, and includes a design portion including a character or a graphic. The light source is provided behind the display panel, and can be turned on and off. The display panel includes: a transparent plate having a back face located on the light source side and a front face located on a side opposite to the light source side; a light shielding portion that is located on the back face side of the transparent plate, covers a portion, of the back face of the transparent plate, that does not correspond to the design portion, and includes a window that is formed at a portion, of the back face of the transparent plate, that corresponds to the design portion; and a light diffusing portion that is located on the back face side of the transparent plate, and covers a portion, of the back face of the transparent plate, that corresponds to the design portion.

In the industrial electronic apparatus based on one aspect of the present invention, the light shielding portion is preferably constituted by a printed layer that is printed on the back face of the transparent plate.

In the industrial electronic apparatus based on one aspect of the present invention, the light diffusing portion is preferably constituted by a printed layer that is printed on the back face of the transparent plate, filling out the window.

In the industrial electronic apparatus based on one aspect of the present invention, the front face of the transparent plate is preferably exposed without being covered by another member or layer.

In the industrial electronic apparatus based on one aspect of the present invention, the light diffusing portion is preferably white, and in this case, the light source preferably emits light of a color other than white.

The industrial electronic apparatus based on one aspect of the present invention further includes an external wiring connection portion in which a plurality of terminals for connecting external wiring are arranged. In this case, it is preferable that the display panel is attached to a region, of the housing, adjacent to the external wiring connection portion, and includes, as the design portion, a plurality of design symbols that are arranged in a layout corresponding to the layout of the plurality of terminals, and in this case, the light source preferably includes a plurality of unit light sources that are arranged in association with the plurality of respective design symbols.

In the industrial electronic apparatus based on one aspect of the present invention, the plurality of design symbols may be numbers indicating the terminal numbers.

The industrial electronic apparatus based on one aspect of the present invention may be a programmable logic controller.

Effects of the Invention

According to the present invention, an industrial electronic apparatus can be provided in which the size of a display portion can be reduced while improving the visibility of the display portion.

EMBODIMENTS OF THE INVENTION

Figure 1:
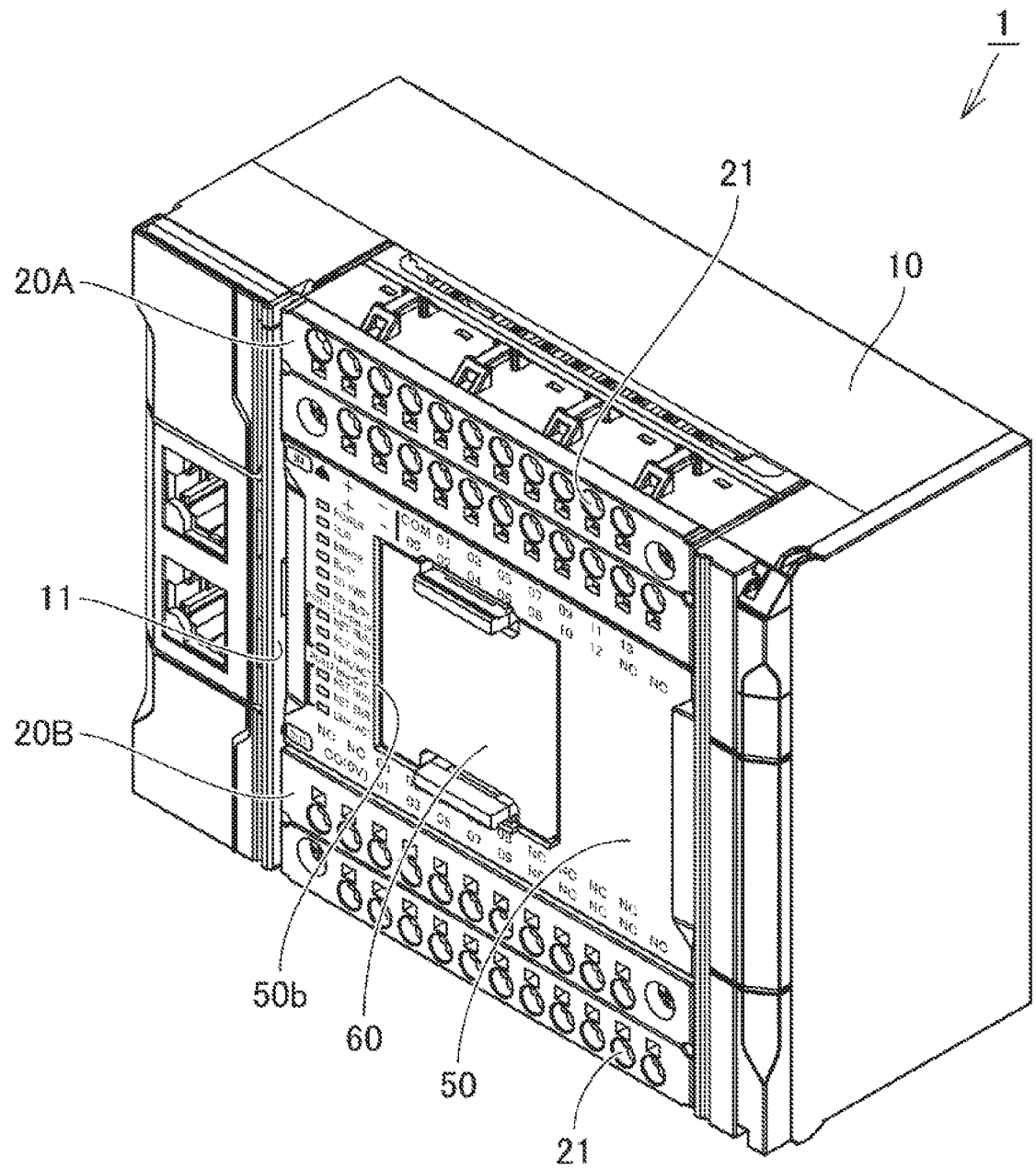
FIG. 1 is a perspective view of a PLC in an embodiment of the present invention.

Hereinafter, an embodiment of the present invention will be described in detail with reference to the drawings. The embodiment described below illustrates a case where the present invention is applied to a PLC, which is an industrial electronic apparatus, but the application of the present invention is not limited thereto, and the present invention can be applied to any industrial electronic apparatuses that include a display portion, such as a sensor device and a power supply device. Note that the same or common portions are assigned the same signs in the drawings, and descriptions thereof will be omitted.

Figure 2:
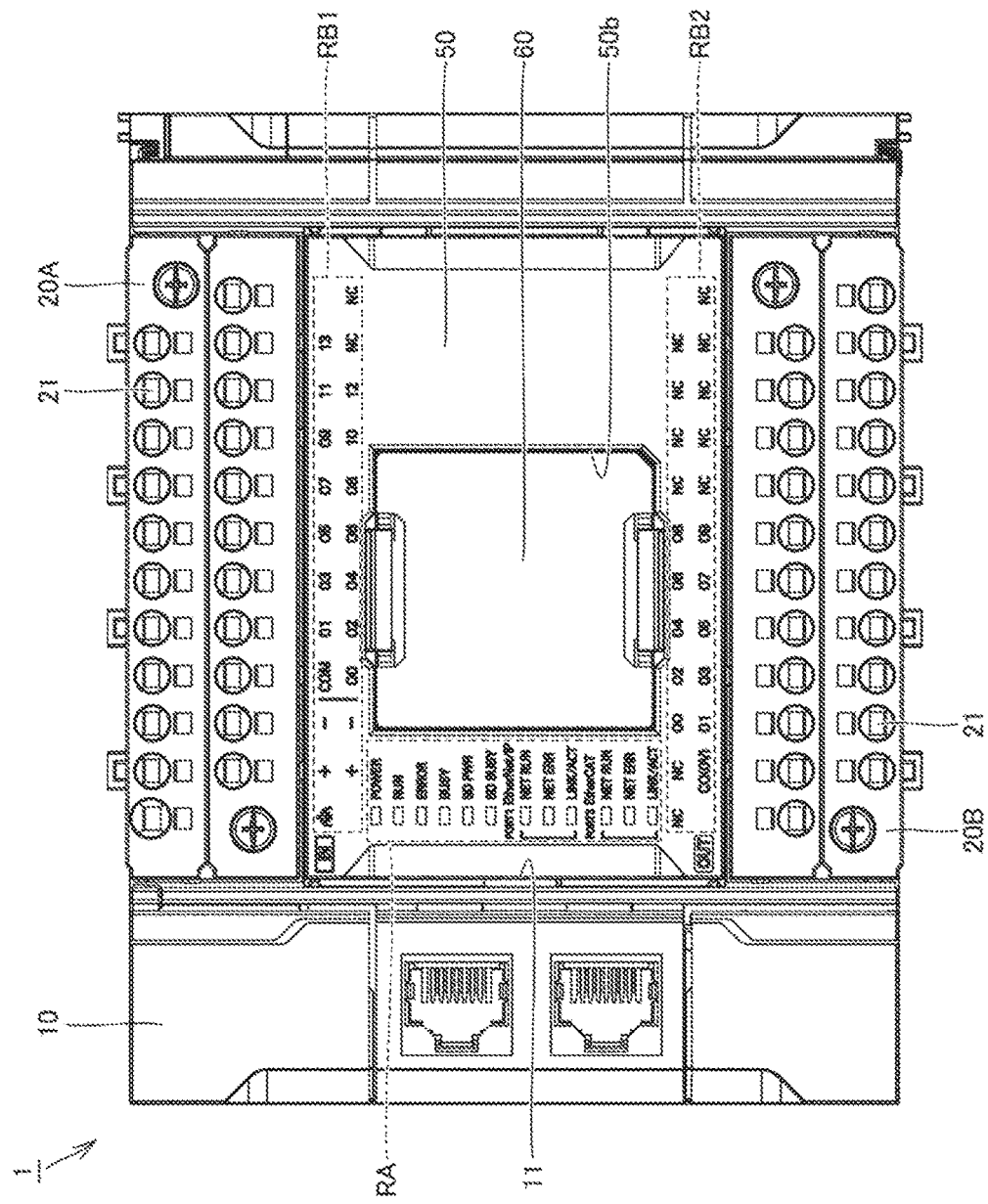
FIG. 2 is a front view of the PLC shown in FIG. 1.
Figure 3:
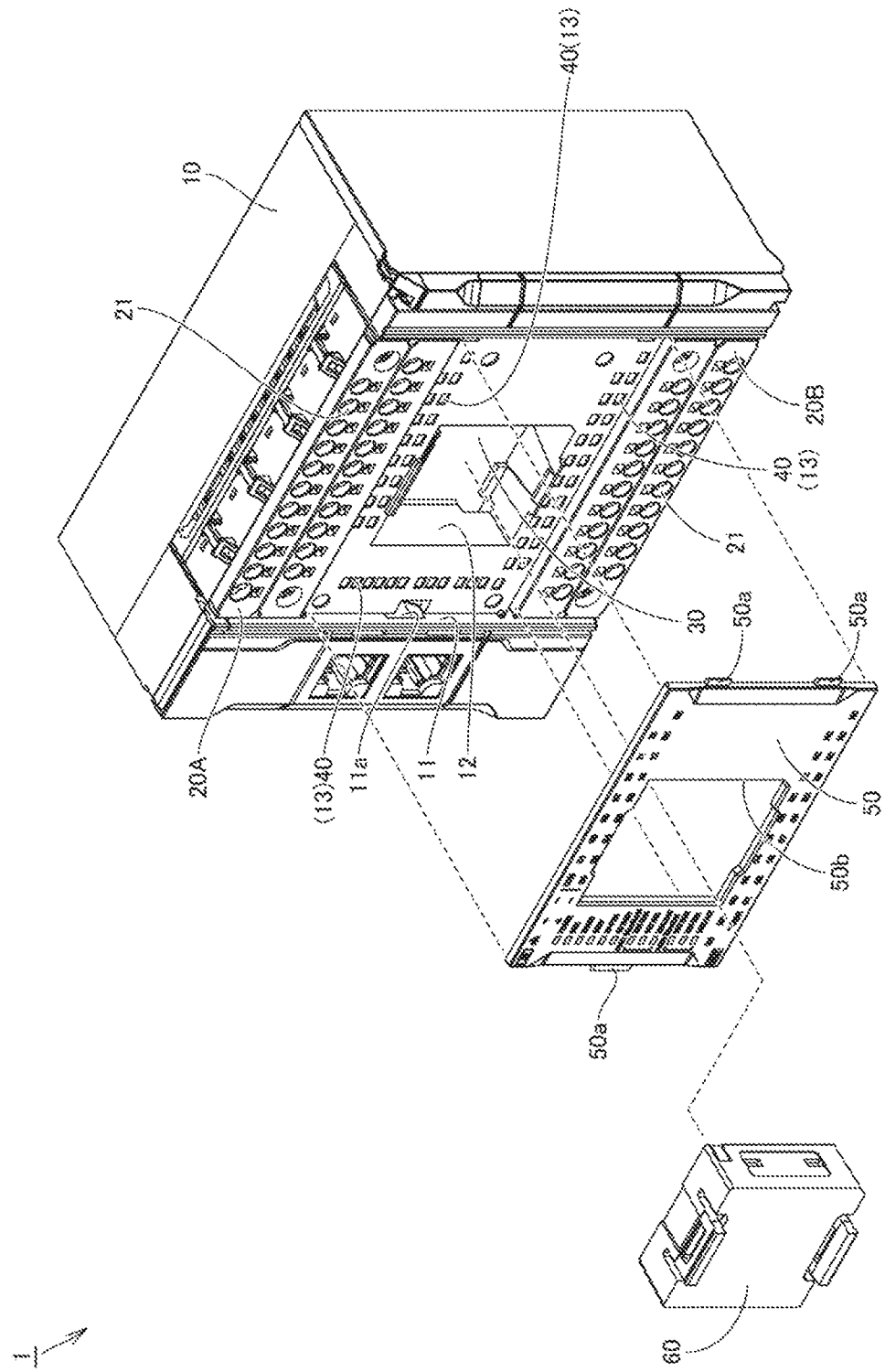
FIG. 3 is an exploded perspective view of the PLC shown in FIG. 1 in the vicinity of a display portion.

FIG. 1 is a perspective view of a PLC in the embodiment of the present invention, and FIG. 2 is a front view of the PLC shown in FIG. 1. Also, FIG. 3 is an exploded perspective view of the PLC shown in FIG. 1 in the vicinity of a display portion. First, the configuration of the PLC 1 in the present embodiment will be described with reference to FIGS. 1 to 3.

As shown in FIGS. 1 to 3, the PLC 1 has an approximately cuboid shape, and includes a housing 10, a pair of terminal blocks 20A and 20B, which is an external wiring connection portion, a wiring substrate 30 on which LEDs (light emitting diodes) 31 (see FIGS. 4 and 5) serving as light sources are mounted (see FIG. 3), light guide members 40 (see FIG. 3), a display panel 50, and a cover member 60. The display portion of the PLC 1 is mainly constituted by the LEDs 31, the light guide members 40, and the display panel 50.

The housing 10 constitutes main portions of a front face, a rear face, an upper face, a lower face, a right side face, and a left side face of the PLC 1 having an approximately cuboid shape. A housing recess 11 for accommodating the display panel 50 is provided in an approximately central portion of the front face of the housing 10, and an opening 12 into which the cover member 60 can be fitted is further provided in an approximately central portion of the bottom face of the housing recess 11.

The terminal blocks 20A and 20B are arranged in the front face of the housing 10. The terminal blocks 20A and 20B are respectively attached to upper and lower portions of the housing 10, sandwiching the housing recess 11 in which the display panel 50 is accommodated.

The terminal block 20A attached to the upper portion of the housing 10 includes, in its inside, a plurality of input terminals for receiving inputs from external apparatuses that are connected to the PLC 1. The terminal block 20B attached to the lower portion of the housing 10 includes, in its inside, a plurality of output terminals for performing outputs to external apparatuses that are connected to the PLC 1.

A plurality of external wiring insertion holes 21, whose number corresponds to the number of the above-mentioned plurality of input terminals, are provided in the front face of the terminal block 20A. The above-mentioned plurality of input terminals are provided behind the respective plurality of external wiring insertion holes 21.

A plurality of external wiring insertion holes 21, whose number corresponds to the number of the above-mentioned plurality of output terminals, are provided in the front face of the terminal block 20B. The above-mentioned plurality of output terminals are provided behind the respective plurality of external wiring insertion holes 21.

In the PLC 1 in the present embodiment, in each of the terminal blocks 20A and 20B, the external wiring insertion holes 21 are provided in two rows, vertically, and eleven external wiring insertion holes 21 are arranged in each row.

The display panel 50 is accommodated in the housing recess 11 provided in the front face of the housing 10, as described above. As shown in FIG. 3, locking claws 50a are provided in the respective two side portions of the display panel 50, and the display panel 50 is attached to the housing 10 by the locking claws 50a engaging with corresponding locking holes 11a provided in the two side faces of the housing recess 11 (some of the locking holes 11a are shown in FIG. 3).

As shown in FIG. 2, the display panel 50 includes an operation state display portion RA and connection state display portions RB1 and RB2. The operation state display portion RA is a part for displaying the operation state of the PLC 1, and specifically performs state display indicating whether power is on or off, the operating mode, alerts, and the like. The connection state display portions RB1 and RB2 are parts for displaying states of connection of wires of external wiring to the terminal blocks 20A and 20B, and specifically display whether or not wires of external wiring are connected to the PLC 1.

The operation state display portion RA is provided in a left portion of the display panel 50 and extends in a vertical direction. Meanwhile, the connection state display portion RB1 is provided, extending in a horizontal direction, adjacent to the terminal block 20A in an upper portion of the display panel 50, and the connection state display portion RB2 is provided, extending in the horizontal direction, adjacent to the terminal block 20B in a lower portion of the display panel 50.

Also, an opening 50b to which the cover member 60 can be fitted is provided in an approximately central portion of the display panel 50, in correspondence with the opening 12 provided in the housing 10. The above-described operation state display portion RA and the connection state display portions RB1 and RB2 are provided along the periphery of the opening 50b.

Here, the operation state display portion RA includes a plurality of design symbols 55A and the connection state display portions RB1 and RB2 include a plurality of design symbols 55B (see FIGS. 4 and 5), as design portions, each of the design symbols constituting a unit display portion.

Specifically, in the PLC 1 in the present embodiment, twelve unit display portions are arranged side by side in the vertical direction in the operation state display portion RA.

Also, in the connection state display portion RB1, unit display portions are provided in two rows, vertically, in a layout corresponding to a portion of the layout of the input terminals provided in the terminal block 20A, and eight unit display portions are provided in an upper row, and nine unit display portions are provided in a lower row.

Furthermore, in the connection state display portion RB2, unit display portions are provided in two rows, vertically, in a layout corresponding to the layout of the output terminals provided in the terminal block 20B, and eleven unit display portions are provided in each of the upper and lower rows.

Here, in the individual unit display portions included in the connection state display portions RB1 and RB2, numbers indicating respective terminal numbers corresponding to the input terminals and output terminals provided in the terminal blocks 20A and 20B are formed as the aforementioned design symbol 55B (see FIG. 5). With this, in the connection state display portions RB1 and RB2, the terminal number are displayed in a layout corresponding to the layout of the input terminals and the output terminals.

As shown in FIG. 3 (refer also to FIGS. 4A to 4C and 5), a plurality of through holes 13 are provided in a bottom face of the housing recess 11 provided in the front face of the housing 10. A light guide member 40 is inserted in each of the plurality of through holes 13.

The plurality of through holes 13 are grouped into a through hole group located in a left portion of the housing recess 11, a through hole group located, adjacent to the terminal block 20A, in an upper portion of the housing recess 11, and a through hole group located, adjacent to the terminal block 20B, in a lower portion of the housing recess 11, and the through hole groups are provided along the periphery of the opening 12 provided in an approximately central portion of the housing recess 11.

The through hole group located in the left portion of the housing recess 11 faces the operation state display portion RA described above, and individual through holes 13 included in this through hole group are respectively associated with the aforementioned unit display portions included in the operation state display portion RA.

Also, the through hole group located in the upper portion of the housing recess 11 faces the connection state display portion RB1 described above, and individual through holes 13 included in this through hole group are respectively associated with the aforementioned unit display portions included in the connection state display portion RB1.

Furthermore, the through hole group located in the lower portion of the housing recess 11 faces the connection state display portion RB2 described above, and individual through holes 13 included in this through hole group are respectively associated with the aforementioned unit display portions included in the connection state display portion RB2.

The wiring substrate 30 is housed inside the housing 10, and the LEDs 31 serving as light sources as described above are mounted on the wiring substrate 30. Accordingly, the LEDs 31 are located behind the display panel 50. Here, the LEDs 31, serving as unit light sources, whose number equals to the number of unit display portions included in the above-described operation state display portion RA and connection state display portions RB1 and RB2 are mounted on the wiring substrate 30.

That is, in the PLC 1 in the present embodiment, because the operation state display portion RA includes 12 unit display portions in total, the connection state display portion RB1 includes 17 unit display portions in total, and the connection state display portion RB2 includes 22 unit display portions in total, the total number of LEDs 31, serving as unit light sources, that are mounted on the wiring substrate 30 is 51.

These plurality of LEDs 31 are driven by an unshown controller of the PLC, and can be turned on and off individually. Note that also light sources other than the aforementioned LED can be used as the light sources.

The light guide members 40 that are inserted into the aforementioned respective plurality of through holes 13 extend toward the inside of the housing 10, and are arranged such that their back ends respectively oppose the corresponding LEDs 31. Accordingly, light emitted from an LED 31 is incident on a corresponding light guide member 40, light that has propagated inside the light guide member 40 is emitted from a front end of the light guide member 40, and the light is incident on the display panel 50.

With reference to FIGS. 1 to 3, the cover member 60 is attached to the housing 10 so as to close the opening 12 provided in the housing 10 and the opening 50b provided in the display panel 50. The opening 12 provided in the housing 10 and the opening 50b provided in the display panel 50 are for installing an adapter for extension when the number of external apparatuses that are to be connected to the PLC 1 is increased, and the cover member 60 is for closing the openings 12 and 50b when no external apparatuses are additionally connected.

Here, two types of configurations are adopted as the configuration of the display portion in the PLC 1 in the present embodiment. One of them is adopted in the above-described operation state display portion RA, and the other is adopted in the above-described connection state display portions RB1 and RB2. The configurations of the two types of display portions will be sequentially described in detail.

Figure 4A:
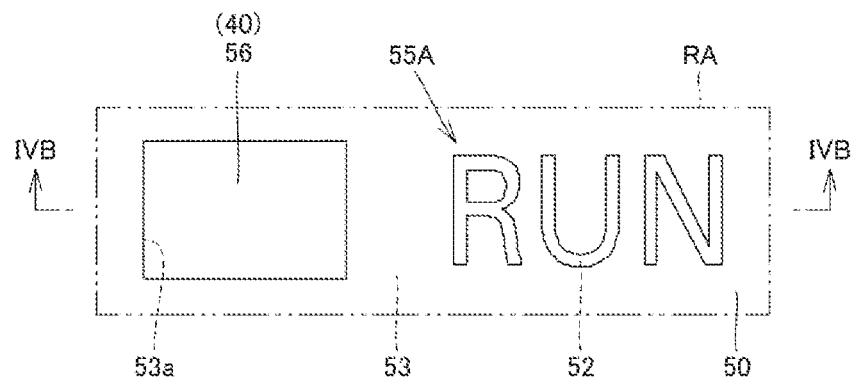
FIGS. 4A to 4C are diagrams illustrating a configuration of an operation state display portion shown in FIG. 2 and states thereof when light is on and off.
Figure 4B:
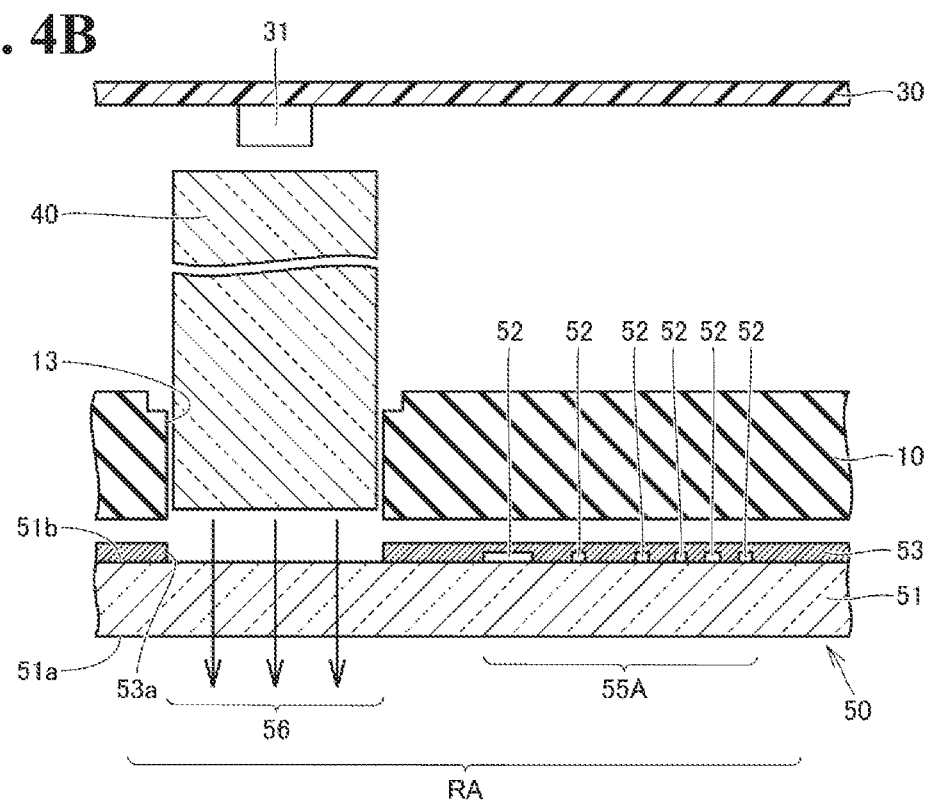
Figure 4C:
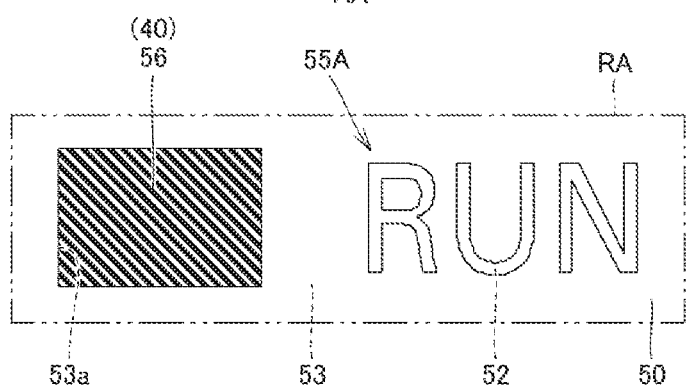

FIGS. 4A to 4C are diagrams illustrating the operation state display portion shown in FIG. 2. Here, FIG. 4A is a diagram schematically shows the state of the operation state display portion when light is off, FIG. 4B is a schematic cross-sectional view taken along line IVB-IVB in FIG. 4A that shows the configuration of the operation state display portion, and FIG. 4C is a diagram schematically shows the state of the operation state display portion when light is on. First, the operation state display portion RA of the PLC 1 in the present embodiment will be described, with reference to FIGS. 4A to 4C. Note that, although the operation state display portion RA includes a plurality of unit display portions, as described above, a description will be given here focusing on only one of them.

As shown in FIGS. 4A to 4C, the operation state display portion RA is mainly constituted by the display panel 50, a light guide member 40, and an LED 31. The operation state display portion RA includes a design symbol 55A formed by characters as a design portion, and a light emitting portion 56 provided adjacent to the design symbol 55A.

As shown in FIG. 4B, a portion corresponding to the operation state display portion RA of the display panel 50 includes a plate-like transparent plate 51 that has a front face 51a and a back face 51b, and a silk printed layer 52 and a light shielding printed layer 53 that are provided on the back face 51b of the transparent plate 51. Here, the back face 51b of the transparent plate 51 is a principal surface, of a pair of principal surfaces of the transparent plate 51, on the side on which the LED 31 and the light guide member 40 are located, and the front face 51a of the transparent plate 51 is a principal surface on the side on which the LED 31 and the light guide member 40 are not located.

The transparent plate 51 is made of a resin member, for example, and a resin member having a high light transmittance is preferably used. Here, the transparent plate 51 is preferably a colorless transparent member, but may be a colored transparent member.

The silk printed layer 52 constitutes the aforementioned design symbol 55A formed by characters. The silk printed layer 52 is a layer formed using a screen printing method with which printing is performed on the transparent plate 51 with ink using a screen printing plate having holes corresponding to the design symbol 55A, and various types of ink can be used as the ink. When the light shielding printed layer 53 is formed using a black ink, as will be described later, white ink is preferably used from a viewpoint of improving visibility.

The light shielding printed layer 53 serving as a light shielding portion constitutes the background of the design symbol 55A. The light shielding printed layer 53 is a layer formed using a screen printing method with which printing is performed on the transparent plate 51 with ink using a screen printing plate having holes corresponding to a portion excluding a later-described window 53a, and any type of ink having a light shielding property can be used as the ink. It is preferable that the light shielding printed layer 53 is formed using a black ink in order to improve the light shielding property.

Here, the silk printed layer 52 is printed so as to be in direct contact with the back face 51b of the transparent plate 51, and the light shielding printed layer 53 is printed, in a portion where the silk printed layer 52 is not formed, so as to be in direct contact with the back face 51b of the transparent plate 51, and is printed, in a portion where the silk printed layer 52 is formed, covering the silk printed layer 52. Accordingly, the silk printed layer 52 can be visually recognized from the outside via the transparent plate 51.

The light shielding printed layer 53 includes the window 53a at a position corresponding to the light guide member 40 that is arranged behind the display panel 50. As a result of the light shielding printed layer 53 being provided with the window 53a, when the LED 31 is turned on, light emitted from the light guide member 40 is projected outside via the window 53a of the light shielding printed layer 53 and the transparent plate 51 at a portion facing the window 53a. With this, the aforementioned light emitting portion 56 is formed.

In the operation state display portion RA configured in this way, the light emitting portion 56 does not emit light when the LED 31 is turned off, as shown in FIG. 4A, and the light emitting portion 56 emits light when the LED 31 is turned on, as shown in FIG. 4C. On the other hand, the design symbol 55A can be visually recognized regardless of whether the LED 31 is turned on and off.

Therefore, in the operation state display portion RA, the visibility of the design symbol 55A can be secured based on the contrast between the silk printed layer 52 and the light shielding printed layer 53, and because light from the light emitting portion 56 is projected outside without being shielded by the light shielding printed layer 53, whether or not the light emitting portion 56 is emitting light can be easily visually confirmed. Therefore, the user can be notified of the operation state based on whether or not light is emitted from the light emitting portion 56 that is adjacent to the design symbol 55A formed by characters.

Also, as a result of adopting the configuration described above, because the silk printed layer 52 that constitutes the design symbol 55A is located on the back face 51b of the transparent plate 51, in the operation state display portion RA, there is no risk that the design symbol 55A is stained or peeled off, and a high visibility can be secured over a long period of time. Also, as a result of adopting this configuration, because the front face 51a of the transparent plate 51 at a portion corresponding to the operation state display portion RA is exposed without being covered by another member or layer, the exposed surface of the display panel 50 (that is, the front face 51a of the transparent plate 51) can be easily cleaned, and in this regard also, a high visibility can be secured.

Note that, although any LEDs that emit various colors can be used as the LED 31, it is preferable that the selection is made considering the color of the light shielding printed layer 53, from a viewpoint of improving the visibility. For example, if the light shielding printed layer 53 is formed using a black ink, an LED that emits green light, red light, blue light, yellow light, orange light, white light, or the like may be selected.

Figure 5A:
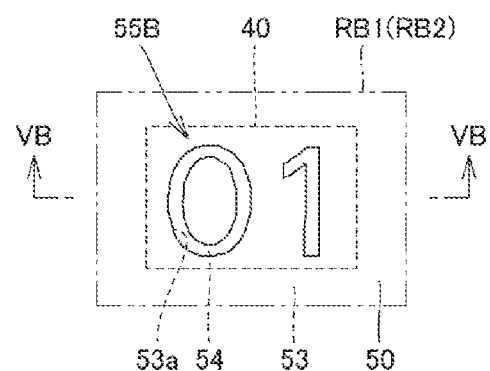
FIGS. 5A to 5C are diagrams illustrating a configuration of a connection state display portion shown in FIG. 2 and states thereof when light is on and off.
Figure 5B:
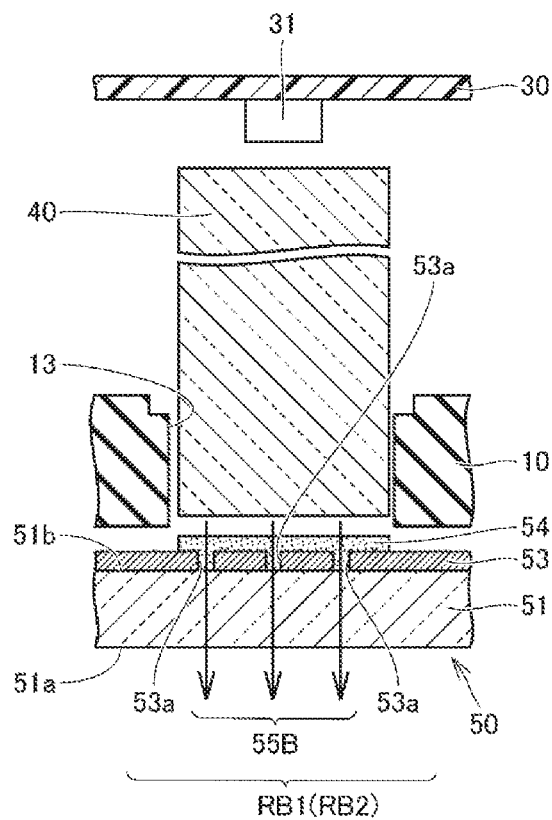
Figure 5C:
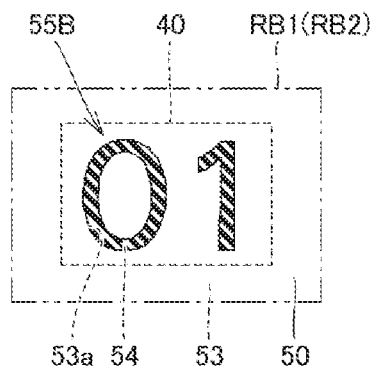

FIGS. 5A to 5C are diagrams illustrating the connection state display portion shown in FIG. 2. Here, FIG. 5A is a diagram schematically shows the state of the connection state display portion when light is off, FIG. 5B is a schematic cross-sectional view taken along line VB-VB in FIG. 5A that shows the configuration of the connection state display portion, and FIG. 5C is a diagram schematically shows the state of the connection state display portion when light is on. Next, the connection state display portions RB1 and RB2 of the PLC 1 in the present embodiment will be described with reference to FIGS. 5A to 5C. Note that, although the connection state display portions RB1 and RB2 include a plurality of unit display portions, as described above, a description will be given here focusing on only one of them.

As shown in FIGS. 5A to 5C, a connection state display portion RB1 or RB2 is mainly constituted by the display panel 50, a light guide member 40, and an LED 31, similarly to the operation state display portion RA described above. The connection state display portion RB1 or RB2 includes a design symbol 55B formed by characters as a design portion.

As shown in FIG. 5B, a portion corresponding to the connection state display portion RB1 or RB2 of the display panel 50 includes a plate-like transparent plate 51 that has a front face 51a and a back face 51b, and a light shielding printed layer 53 and a light diffusing printed layer 54 that are provided on the back face 51b side of the transparent plate 51.

Because the transparent plate 51 and the light shielding printed layer 53 are similar to those in the operation state display portion RA described above, their description will not be repeated here. Note that the light shielding printed layer 53 serving as a light shielding portion includes a window 53a having a shape corresponding to the design symbol 55B formed by characters in a region facing the light guide member 40 that is arranged behind the display panel 50. The window 53a is formed by using a screen printing plate that has holes corresponding to the portions other than the aforementioned window 53*a*, when the light shielding printed layer 53 is printed using a screen printing method.

The light diffusing printed layer 54 serving as a light diffusing layer constitutes the above-described design symbol 55B formed by characters. The light diffusing printed layer 54 is a layer formed using a screen printing method with which printing is performed on the transparent plate 51 with ink using a screen printing plate, and an ink having a light diffusing property is used as the ink. An ink having a light diffusing property, in general, appears white when illuminated with natural light (white light), and exhibits, when illuminated with light having a specific color other than white, a color close to the specific color.

Here, the light shielding printed layer 53 is printed so as to be in direct contact with the back face 51*b* of the transparent plate 51, and the light diffusing printed layer 54 is printed so as to be in direct contact with the back face 51*b* of the transparent plate 51 at the window 53*a* by filling the window 53*a* of the light shielding printed layer 53. Accordingly, the light diffusing printed layer 54 can be visually recognized from the outside via the transparent plate 51.

Also, since the light shielding printed layer 53 has the window 53*a* having a shape corresponding to the design symbol 55B formed by characters in a region facing the light guide member 40 that is arranged behind the display panel 50, as described above, when the LED 31 is turned on, light emitted from the light guide member 40 is projected outside via the light diffusing printed layer 54 and a portion of the transparent plate 51 facing the light diffusing printed layer 54.

Note that, although any LEDs that emit various colors other than white can be used as the LED 31, it is preferable that the selection is made considering the color of the light shielding printed layer 53, from a viewpoint of improving the visibility. For example, if the light shielding printed layer 53 is formed using a black ink, an LED that emits green light, red light, blue light, yellow light, orange light, or the like may be selected.

In the connection state display portions RB1 and RB2 configured in this way, the design symbol 55B can be visually recognized when the LED 31 is turned off, as shown in FIG. 5A, and the design symbol 55B itself emits light of a color corresponding to the color of light emitted from the LED 31 when the LED 31 is turned on, as shown in FIG. 5C.

Therefore, in the connection state display portions RB1 and RB2, the visibility of the design symbol 55B can be secured based on the contrast between the light diffusing printed layer 54 and the light shielding printed layer 53 when the LED 31 is turned off, and when the LED 31 is turned on, light from the LED 31 is projected outside without being shielded by the light shielding printed layer 53 via the light diffusing printed layer 54, and therefore, the design symbol 55B emits light of a color different from that when the LED 31 is turned off, and whether or not the design symbol 55B emits light can be confirmed with favorable visibility. Therefore, the user can be notified of the connection state based on whether or not the design symbol 55B formed by characters is lighted.

Here, when the configuration of the connection state display portions RB1 and RB2 is adopted, the problem that the visibility of the design symbol 55B when light is on decreases compared with the visibility of the design symbol 55B when light is off does not occur. This is because the design symbol 55B itself emits light when light is on, and therefore, the visibility can be prevented from decreasing, compared with a configuration of a conventional display portion in which a design symbol that displays a state is directly provided by silk printing or the like on a light emitting portion constituted by a display window of a light source that is turned on and off.

Also, as a result of adopting the configuration described above, because the light diffusing printed layer 54 that constitutes the design symbol 55B is located on the back face 51*b* of the transparent plate 51, in the connection state display portions RB1 and RB2, there is no risk that the design symbol 55B is stained or peeled off, and a high visibility can be secured over a long period of time. Also, as a result of adopting this configuration, because the front face 51*a* of the transparent plate 51 at a portion corresponding to the connection state display portion RB1 or RB2 is exposed without being covered by another member or layer, the exposed surface of the display panel 50 (that is, the front face 51*a* of the transparent plate 51) can be easily cleaned, and in this regard also, a high visibility can be secured.

Here, the reason why, in the PLC 1 in the present embodiment, the operation state display portion RA adopts a configuration in which the design symbol 55A and the light emitting portion 56 are included, as described above, and the connection state display portions RB1 and RB2 adopt a configuration in which the design symbol 55B is included, as described above, is as follows.

First, due to restriction regarding layout of the portions on the front face of the PLC 1 in the present embodiment, a relatively large space can be secured for providing the operation state display portion RA, but the space for providing the connection state display portions RB1 and RB2 is relatively small.

In the configuration shown in FIG. 4 described above, because the light emitting portion 56 needs to be provided adjacent to the design symbol 55A, a relatively large space is necessarily required for a space for providing the display portion. On the other hand, in the configuration shown in FIG. 5 described above, because the display portion can be provided in a space that can accommodate only the design symbol 55B, the display portion can be provided in a space that is substantially smaller than that in the configuration shown in FIG. 4.

As described above, as a result of the display portion adopting the configuration that is adopted in the connection state display portions RB1 and RB2 of the PLC 1 in the present embodiment, the size of the display portion can be reduced while improving its visibility.

Secondly, in the operation state display portion RA, the number of characters included in the design symbol 55A is relatively large, but, in the connection state display portions RB1 and RB2, the number of characters included in the design symbol 55B is relatively small.

In the configuration shown in FIG. 5 described above, if the number of characters of the design symbol 55B is large, the size of the light guide member 40 needs to be increased in accordance therewith, and the light amount inevitably decreases. In order to prevent the light amount from decreasing, the luminance of the LED 31 needs to be increased, which causes the component cost to increase.

Therefore, as a result of adopting the configuration as shown in FIG. 4 as the operation state display portion RA, an effect that the manufacturing cost can be reduced can be obtained, and meanwhile, as a result of adopting the configuration as shown in FIG. 5 as the connection state display portions RB1 and RB2, the size of the display portion can be reduced without increasing the manufacturing cost.

Note that, in the embodiment of the present invention described above, a description has been given illustrating a case where the configuration as shown in FIG. 4 is adopted as the operation state display portion RA, but the configuration as shown in FIG. 5 may also be adopted as the operation state display portion RA in addition to the connection state display portions RB1 and RB2.

Also, in the embodiment of the present invention described above, a description has been given illustrating a case where the light shielding portion and the light diffusing portion are constituted by the light shielding printed layer and the light diffusing printed layer that have been formed using a screen printing method, but one of or both of the light shielding portion and the light diffusing portion may be formed using another printing method (ink-jet method, for example).

In addition, in the embodiment of the present invention described above, a description has been given illustrating a case where the light shielding portion and the light diffusing portion are constituted by printed layers, but one of or both of the light shielding portion and the light diffusing portion may be constituted by a film that is formed using a method other than printing, or may be constituted by a sheet-like member.

Also, in the embodiment of the present invention described above, a description has been given illustrating a case where characters are adopted as the design symbol 55B, but the characters may, of course, be changed to a graphic, a combination of a graphic and a character, or the like.

Furthermore, in the embodiment of the present invention described above, a description has been given illustrating a case where the display portion is constituted by a light source, a light guide member, and a display panel, but the light guide member may be omitted.

In this way, the above-described embodiment disclosed here is to be considered in all respects as illustrative and not limiting. The technical scope of the present invention should be construed in view of the appended claims, and all changes that come within the meaning and range of equivalency of the claims are intended to be embraced therein.

INDEX TO THE REFERENCE NUMERALS

1 PLC
10 Housing
11 Housing recess
11a Locking hole
12 Opening
13 Through hole
20A, 20B Terminal block
21 External wiring insertion hole
30 Wiring substrate
31 LED
40 Light guide member
50 Display panel
50a Locking claw
50b Opening
51 Transparent plate
51a Front face
51b Back face
52 Silk printed layer
53 Light shielding printed layer
53a Window
54 Light diffusing printed layer
55A, 55B Design symbol
56 Light emitting portion
60 Cover member
RA Operation state display portion
RB1, RB2 Connection state display portion

The invention claimed is:

1. An industrial electronic apparatus comprising:
a housing;
a display panel that is attached to the housing, and comprising a design portion comprising at least one of: a character; and a graphic;
a light source provided behind the display panel, and capable of being turned on and off, wherein
the display panel further comprises:
a transparent plate comprising a back face located on a light source side and a front face located on a side opposite to the light source side;
a light shielding portion located on a back face side of the transparent plate, covering a portion of the back face of the transparent plate that does not correspond to the design portion, and comprising a window formed at a portion of the back face of the transparent plate that corresponds to the design portion; and
a light diffusing portion located on the back face side of the transparent plate, and covering a portion of the back face of the transparent plate that corresponds to the design portion, wherein
the front face of the transparent plate is exposed without being covered by another member or layer, and
the light diffusing portion fills out the window such that the back face of the transparent plate in the portion corresponding to the window is not exposed.

2. The industrial electronic apparatus according to claim 1, wherein the light shielding portion comprises a printed layer printed on the back face of the transparent plate.

3. The industrial electronic apparatus according to claim 2, wherein the light diffusing portion comprises the printed layer that is printed on the back face of the transparent plate such that the printed layer fills out the window.

4. The industrial electronic apparatus according to claim 3, wherein
the light diffusing portion is white, and
the light source emits light of a color other than white.

5. The industrial electronic apparatus according to claim 3, further comprising:
an external wiring connection portion in which a plurality of terminals for connecting external wiring are arranged, wherein
the display panel is attached to a region, of the housing, adjacent to the external wiring connection portion, and comprises, as the design portion, a plurality of design symbols that are arranged in a layout corresponding to the layout of the plurality of terminals, and
the light source comprises a plurality of unit light sources that are arranged in association with the plurality of respective design symbols.

6. The industrial electronic apparatus according to claim 5, wherein the plurality of design symbols comprise numbers indicating terminal numbers.

7. The industrial electronic apparatus according to claim 3, wherein the industrial electronic apparatus comprises a programmable logic controller.

8. The industrial electronic apparatus according to claim 2, wherein
the light diffusing portion is white, and
the light source emits light of a color other than white.

9. The industrial electronic apparatus according to claim 2, further comprising:
an external wiring connection portion in which a plurality of terminals for connecting external wiring are arranged, wherein the display panel is attached to a region, of the housing, adjacent to the external wiring connection portion, and comprises, as the design portion, a plurality of design symbols that are arranged in a layout corresponding to the layout of the plurality of terminals, and the light source comprises a plurality of unit light sources that are arranged in association with the plurality of respective design symbols.

10. The industrial electronic apparatus according to claim 9, wherein the plurality of design symbols comprise numbers indicating terminal numbers.

11. The industrial electronic apparatus according to claim 2, wherein the industrial electronic apparatus comprises a programmable logic controller.

12. The industrial electronic apparatus according to claim 1, wherein the light diffusing portion is white, and the light source emits light of a color other than white.

13. The industrial electronic apparatus according to claim 1, further comprising:

an external wiring connection portion in which a plurality of terminals for connecting external wiring are arranged, wherein the display panel is attached to a region of the housing adjacent to the external wiring connection portion, and comprises, as the design portion, a plurality of design symbols that are arranged in a layout corresponding to the layout of the plurality of terminals, and the light source comprises a plurality of unit light sources that are arranged in association with the plurality of respective design symbols.

14. The industrial electronic apparatus according to claim 13, wherein the plurality of design symbols comprise numbers indicating terminal numbers.

15. The industrial electronic apparatus according to claim 1, wherein the industrial electronic apparatus comprises a programmable logic controller.

* * * * *